US009111615B1

(12) United States Patent
Jiang

(10) Patent No.: US 9,111,615 B1
(45) Date of Patent: Aug. 18, 2015

(54) RAM-BASED TERNARY CONTENT ADDRESSABLE MEMORY

(71) Applicant: Xilinx, Inc., San Jose, CA (US)

(72) Inventor: Weirong Jiang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 45 days.

(21) Appl. No.: 14/043,679

(22) Filed: Oct. 1, 2013

(51) Int. Cl.
*G11C 15/00* (2006.01)
*G11C 15/04* (2006.01)
*G06F 17/30* (2006.01)

(52) U.S. Cl.
CPC .......... *G11C 15/04* (2013.01); *G06F 17/30982* (2013.01)

(58) Field of Classification Search
CPC ...................................................... G11C 15/04
USPC ...................................................... 365/49.17
See application file for complete search history.

(56) References Cited

U.S. PATENT DOCUMENTS

| 7,233,597 | B2 * | 6/2007 | Kumar et al. ................. | 370/401 |
| 2003/0108043 | A1 * | 6/2003 | Liao ............................. | 370/392 |

OTHER PUBLICATIONS

Jiang, Weirong et al., "Field-Split Parallel Architecture for High Performance Multi-Match Packet Classification Using FPGAs," Aug. 11, 2009, pp. 188-196, *21st ACM Symposium on Parallelism in Algorithms and Architectures*, ACM, New York, New York, USA.
Locke, Kyle, *Parameterizable Content-Addressable Memory*, XAPP1151 (v1.0), Mar. 1, 2011, pp. 1-31, Xilinx, Inc., San Jose, California, USA.
Zerbini, Carlos A., "Performance Evaluation of Packet Classification on FPGA-based TCAM Emulation Architectures," *2012 IEEE Global Communications Conference*, Dec. 3, 2012, pp. 2766-2771, IEEE, Piscataway, New Jersey, USA.

\* cited by examiner

*Primary Examiner* — Son Mai
(74) *Attorney, Agent, or Firm* — LeRoy D. Maunu

(57) ABSTRACT

A memory is disclosed that includes one or more TCAM memory units, each configured to store a respective set of rules. Each unit has an input coupled to receive an input search key from an input of the memory and includes a plurality of stages 1 through H. Each stage is configured to receive a respective multi-bit segment of the input search key and provide a result segment in response thereto. The result segment includes, for each rule of the respective set of rules, a bit that indicates whether or not the rule matches the segment of the input search key. Each unit also includes a first output circuit configured to generate a combined result indicating which rules match all of the respective segments received by each of the plurality of stages. The memory can also include one or more update circuits to update rules in a plurality of units.

19 Claims, 9 Drawing Sheets

RAM-BASED TERNARY CONTENT ADDRESSABLE MEMORY

TECHNICAL FIELD

The disclosure generally relates to ternary-content-addressable-memory (TCAM) circuits, and more particularly relates to methods and circuits for implementing TCAM functions using random access memory (RAM).

BACKGROUND

RAM circuits are wed-known data storage devices that store data values in an array of addressed memory locations. To determine whether a particular data value is stored in a typical RAM, an address-based data searching method is performed. Data values are sequentially read out from the RAM and compared with the particular data value. Specifically, a series of addresses are transmitted to an address port of the RAM, thereby causing data values to be read out from the memory locations associated with the addresses and transmitted to an output port of the RAM. A separate comparator circuit is then used to compare each of the output data values with the searched-for data value, and to generate a signal when a match occurs. When a large number of data values are searched, such address-based search operations are very time consuming because only one data value is searched/compared each dock cycle.

Content-addressable-memory (CAM) circuits are a particular type of data storage device in which a data value is searched for by its content, rather than by its address. Data values are stored (pre-loaded) in CAM circuits such that each data value is assigned to a row or column of an array of CAM cells. To determine whether a particular data value is stored in the CAM circuit, a content-based data match operation is performed in which the searched-for data value is simultaneously compared with the rows/columns containing the pre-loaded data values. When one or more of the pre-loaded data values match the searched-for data value, a "match" signal is generated by the CAM circuit, along with an address indicating the storage location of the stored data value. By simultaneously comparing the searched-for data value with several pre-loaded data values, a CAM circuit is able to simultaneously check multiple stored data values in a single clock cycle. In comparison to RAM, CAM circuits significantly reduce the search time needed to locate a particular data value from a large number of data values. One type of CAM, referred to as ternary-content-addressable-memory (TCAM), stores ternary bit values, having three possible states, for example, logic one, logic zero, and wildcard (*). A stored bit having the wildcard * value will match a bit of a search word having either a logic one or a logic zero value. For example, an input search word 1010 will match multiple ternary values including: 1010, *010, 1*10, 10*0, 101*, 10, 10, 10, *0, 1*, and **. Ternary values stored in a TCAM may be referred to as rules. The searched-for data value may be referred to as a search key.

Existing TCAM circuits are comparatively expensive and power-hungry, and do not scale well with respect to clock rate or circuit area as the number of bits in the stored rules is increased. While various algorithmic TCAMs have been proposed, the memory requirements of these algorithmic TCAMs often depend on the distribution of wildcard bits in the ternary rules to be stored and searched by the TCAM. For example, an algorithmic TCAM configured to store and search N W-bit rules concurrently may require as many as $O(N^W)$ memory cells.

SUMMARY

In some various implementations, a memory includes a TCAM memory unit configured to store a set of rules. The TCAM memory unit includes a plurality of stages, 1 through H. Each stage is configured to receive a respective segment of an input search key and provide a respective result segment at an output of the stage. The result segment includes, for each rule of the set of rules, a bit having a state that indicates whether or not the rule matches the respective segment of the input search key. A bitwise AND circuit is coupled to outputs of stages 1 and 2 of the plurality of stages and is configured to perform a bitwise AND of the result segments generated by the stages 1 and 2 and output a combined result having, for each rule of the set of rules, a respective bit having a state that indicates if the rule matches both of the respective segments received by stages 1 and 2.

For each stage X, wherein $3 \leq X \leq H$, the TCAM memory unit includes a respective bitwise AND circuit coupled to stage X and configured to provide a combined result equal to a bitwise AND of the result segment provided by stage X and the combined result provided by the bitwise AND circuit coupled to stage X−1. The combined result provided by the bitwise AND coupled to stage X has a respective bit for each rule of the set of rules. The respective bit has a state that indicates if the rule matches all of the respective segments received by stages 1 through X.

In some implementations, a memory includes a plurality of TCAM memory units, each configured to store a respective set of rules. Each of the TCAM memory units has an input coupled to receive an input search key from an input of the memory and includes a plurality of stages 1 through H. Each stage is configured to receive a respective multi-bit segment of the input search key and provide a result segment in response thereto. The result segment includes, for each of the respective set of rules, a bit having a state that indicates whether or not the rule matches the segment of the input search key. Each TCAM memory unit also includes a first output circuit configured to generate a combined result including, for each rule of the set of rules, a respective bit having a state that indicates if the rule matches all of the respective segments received by each of the plurality of stages. The memory includes a second output circuit configured to receive the combined results generated by each of the plurality of TCAM memory units. In response to one or more of the combined results indicating that one or more rules match all of the respective segments, the second output circuit prioritizes the one or more rules and outputs a signal identifying the one having the highest priority among the one or more rules. The memory includes one or more update circuits, each configured to update rules in a plurality of TCAM memory units.

Other features will be recognized from consideration of the Detailed Description and Claims, which follow.

BRIEF DESCRIPTION OF THE DRAWINGS

Various aspects and features of the invention will become apparent upon review of the following detailed description and upon reference to the drawings, in which.

DETAILED DESCRIPTION

A scalable RAM-based TCAM is disclosed. In some implementations, a TCAM memory unit includes a plurality of stages. Each stage includes one or more RAM circuits and is configured to store a respective portion of each of the ternary rules stored in the TCAM memory unit. For instance, a first stage may be configured to store the first byte of each rule and a second stage may be configured to store the second byte of each rule. Rather than storing ternary bits of the rules, the rules are stored by way of data words in which a segment of an input search key is used as a memory address, and the data word at the memory address indicates whether or not the segment of the input search key satisfies each rule. Each data word has a respective bit for each of the rules stored in the TCAM memory unit. The respective bit indicates whether or not the segment of the input search key satisfies a portion of the corresponding rule stored in the stage. The segment of the input search key satisfies the portion of the rule when bits of the segment match the bits of the portion of the rule.

In response to the TCAM memory unit receiving an input search key, each stage is provided with a respective segment of the search key. The stage retrieves a data word from the memory as addressed by the search key segment. The retrieved data word indicates which rules match the search key segment. An output circuit combines the retrieved data words from the stages to determine if any of the rules match all of the search key segments in the respective stages. In this manner, the TCAM memory circuit concurrently searches all of the stored rules for a match to the input search key. As described in the following, the disclosed TCAM circuits provide a memory-efficient method for implementing a TCAM using RAM circuits.

Figure 1:
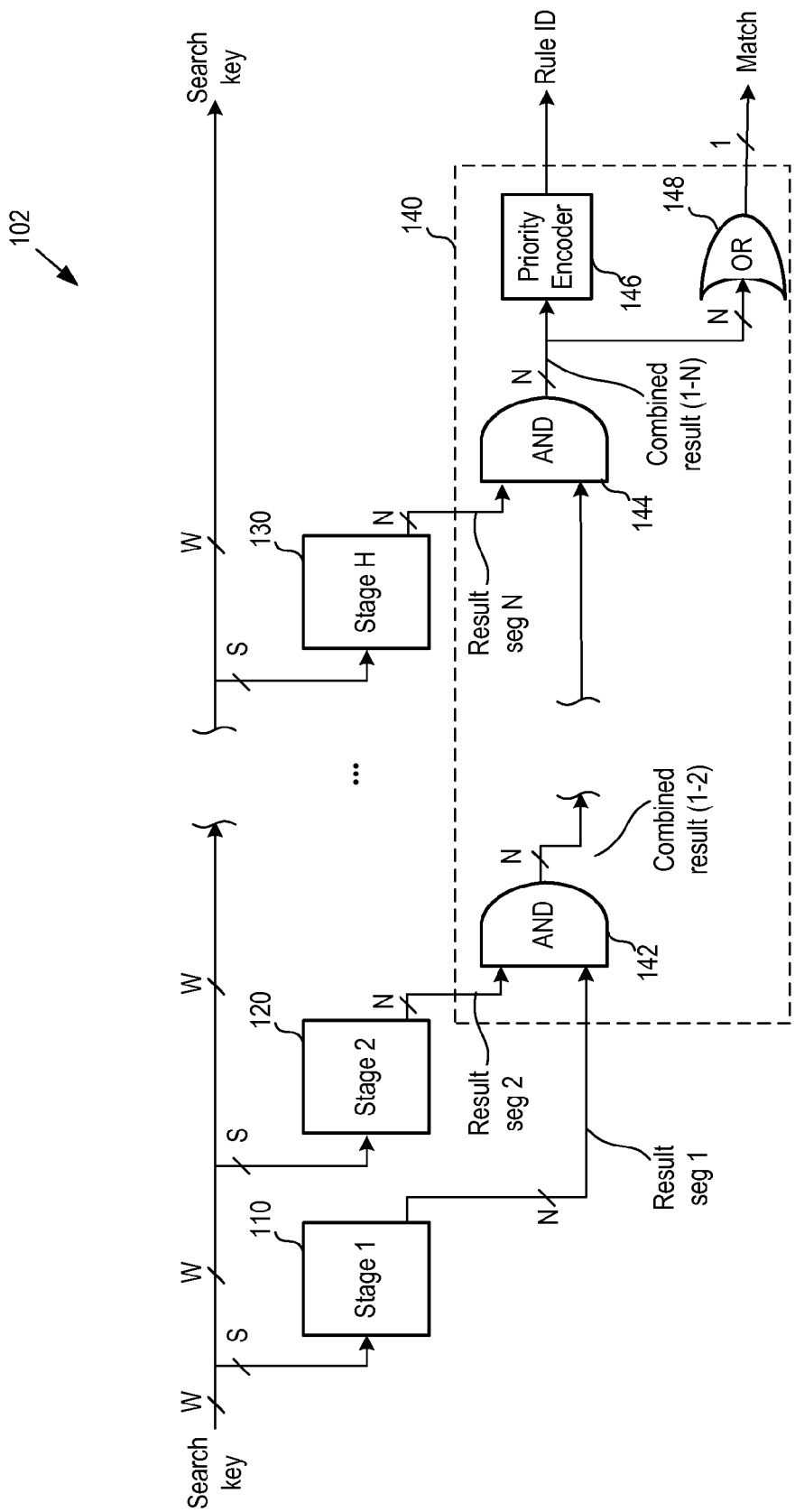
FIG. 1 shows a TCAM memory unit for a RAM-based TCAM.

Turning now to the figures, FIG. 1 shows a TCAM memory unit that may be used for a scalable RAM-implemented TCAM. The TCAM memory unit 102 is configured to store a set of rules across a plurality of stages, 1 through H (110, 120, and 130). In response to an input search key, the TCAM memory unit determines if any rule of the stored set of rules matches the input search key.

The TCAM memory unit 102 is configured to split an input search key into a plurality of segments and search each of the stages 110, 120, and 130 to determine if a respective segment satisfies a portion of any of the rules. In each stage, a data word is stored at each memory address of a RAM. Each bit of each data word indicates whether or not the search key segment satisfies a corresponding portion of one of the rules. Each rule of the set of rules corresponds to a respective bit position in the data words stored in the stages.

Table 1 shows a simplified example of a RAM-based TCAM configured to store and search for three 4-bit rules across two stages. In this example, the memory of each stage is addressed by 2-bit addresses and thus, is used to indicate when two respective bits of each 4-bit rule are satisfied. In general, a stage having P-bit memory addresses may indicate up to P bits of a rule.

TABLE 1

| | Stage 1 | | | Stage 2 | | |
| --- | --- | --- | --- | --- | --- | --- |
| Address | Rule 1 | Rule 2 | Rule 3 | Rule 1 | Rule 2 | Rule 3 |
| 00 | 0 | 0 | 0 | 1 | 1 | 0 |
| 01 | 0 | 0 | 0 | 0 | 1 | 1 |
| 10 | 0 | 1 | 1 | 0 | 1 | 0 |
| 11 | 1 | 0 | 1 | 0 | 1 | 1 |

In the example of Table 1, there are three 4-bit rules, 1100, 10, and 11. Stage 1 indicates when the first two bits of each rule are satisfied by the search key and stage 2 indicates when the second two bits of each rule are satisfied by the search key. The data words in each of the stages are 3 bits wide. Each bit of a data word corresponds to a portion of a respective one of the rules. The value logic 1 of a bit in the data word indicates that the portion of the rule in the stage is satisfied by the search key segment used to address the data word. The value logic 0 indicates that the search key segment does not satisfy the portion of the rule.

In stage 1, the data word stored at each address indicates if the first two bits of rules 1, 2, and 3 are satisfied when the first two bits of the search key segment are equal to the corresponding memory address at which the data word is stored. In stage 2, the data word stored at each address indicates if the last two bits of rules 1, 2, and 3 are satisfied when the last two bits of the search key segment are equal to the corresponding memory address at which the data word is stored. For the first rule (1100), logic 1 is stored at bit 1 of memory address 11 in stage 1 and at bit 1 of memory address 00 in stage 2. For the second rule (10), logic 1 is stored at bit 2 of memory address 10 in stage 1 and at bit 2 of memory addresses 00, 01, 10, and 11 in stage 2. For the third rule (11), logic 1 is stored at bit 3 of memory addresses 10 and 11 in stage 1 and at bit 2 of memory addresses 01 and 11 in stage 2. Thus, when a search key 1100 is input, the data word 101 is retrieved from address 11 of stage 1, which indicates that the first 2-bit segment of rules 1 and 3 is satisfied by the search key. Similarly, the data word 110 is retrieved from the address 00 of stage 2, which indicates that the rules 1 and 2 are satisfied, but not rule 3. Since only rule 1 is satisfied by the search key in both of stages 1 and 2, only rule 1 is satisfied by the input search key.

In FIG. 1, each of the stages 110, 120, and 130 is configured to receive a respective S-bit segment of an input W-bit search key and output an N-bit result segment stored at a memory location addressed by the S-bit segment. The result segment output by each stage includes a respective bit for each rule that indicates if the portion of the rule stored in the stage matches the search key segment.

The entire input search key matches a rule if the result segments output by all the stages 110, 120, and 130 indicate that the respective segment of the input search key matches the portion of the rule stored in the respective stage. The TCAM memory unit 102 includes an output circuit 140 configured to determine if any rule of the set of rules matches all of the respective search key segments. In this example, the output circuit 140 is configured to perform a bitwise AND of the output search results from stages 1-H to produce a combined result having a respective bit, for each rule, that indicates if the rule matches the input search key.

In the example shown in FIG. 1, the output circuit 140 includes a first bitwise AND circuit 142 configured to perform a bitwise AND of the result segments output by the stages 1 and 2 to produce a combined result. The combined result has, for each rule, a respective bit having a state that indicates if the rule matches both of the respective segments of the input search key received by stages 1 and 2.

For each stage X following stage 2, the output circuit 140 includes a respective bitwise AND circuit, e.g., 144. The respective bitwise AND circuit is configured to provide a combined result equal to a bitwise AND of the search result output by stage X and the combined result output by the bitwise AND circuit coupled to stage X−1. The combined result provided by the AND circuit coupled to stage X has a respective bit for each rule that indicates if the rule matches all of the respective search key segments received by stages 1 through X.

In this example, the output circuit 140 includes a priority encoder 146 configured to determine which rule of multiple rules satisfied by the search key, has the highest priority. In some implementations, priority of the rules is indicated by the bit position, where the highest priority rule is indicated at the most significant bit position of the stored data words and the least priority rule is indicated at the least significant bit position of the stored data words. In such implementations, the priority encoder is configured to determine the rule with the highest priority by determining the most significant bit of the combined result that is set to logic 1. The bit position of the most significant bit is output as a unique identifier of the matching rule value having the highest priority. For each of reference, the bit position of a rule may be referred to as a rule-ID.

In some implementations, the output circuit 140 also includes a status circuit 148 configured to output a match signal indicating whether or not any of the stored rules match the input search key. In this example, the status circuit 148 is implemented by an OR gate having a plurality of inputs coupled to receive respective bits of the combined result output from the last bitwise AND circuit 144. If any of the bits in the combined result is set to logic 1, a matching rule has been found and the status signal is set high.

In some implementations, each stage is configured to determine if a respective S-bit segment of the input search key matches S-bit segments of any of the stored rules. In some other implementations, different stages are configured to receive different size segments of the input search key and determine if the received segment matches the portions of the rules stored in the stage. For instance, the first stage may be configured to receive 8 bits of the input search key and a second stage may be configured to receive 4 bits of the input search key.

In some implementations, each stage of the memory unit 102 stores a segment of each rule using a single RAM circuit. In some other implementations, each stage of the memory unit 102 may store the segment of each of the rules across a plurality of RAM circuits. For instance, in some implementations, each stage may divide a corresponding segment of a rule into multiple sub-segments and store each sub-segment using a respective RAM circuit.

Figure 2:
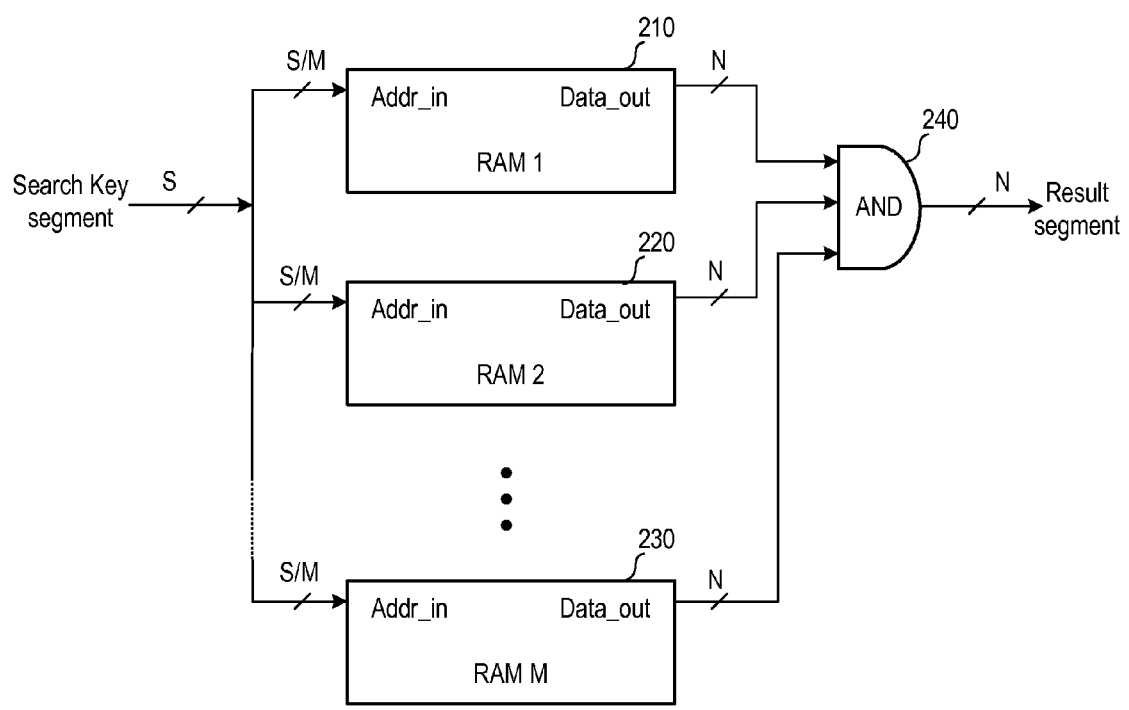
FIG. 2 shows a block diagram of one stage of a multi-stage TCAM memory unit.

FIG. 2 shows a block diagram of a stage configured to store rules using a plurality of RAM circuits. The stage may be used, for example, to implement each stage of the TCAM memory unit shown in FIG. 1. The stage includes a plurality of RAM circuits 210, 220, and 230. Each RAM circuit is configured to store a sub-segment of each rule as described with reference to the stages in TABLE 1. In this example, the stage is configured to store an S-bit segment of each rule, and each of the RAM circuits 1-M is configured to store S/M bits of each rule.

Each of the RAM circuits 210, 220, and 230 is configured to receive a respective (S/M)-bit sub-segment of the S-bit search key segment provided to the stage and output a result sub-segment stored at the memory address specified by the received (S/M)-bit sub-segment. The result segment includes a respective bit for each of the rules, and the bit indicates whether or not the sub-segment of the rule stored in the RAM matches the (S/M)-bit sub-segment. The stage shown in FIG. 2 includes an output circuit 240 configured to perform a bitwise AND of the result sub-segments output from each of the RAM circuits to produce the result segment of the stage.

Figure 3:
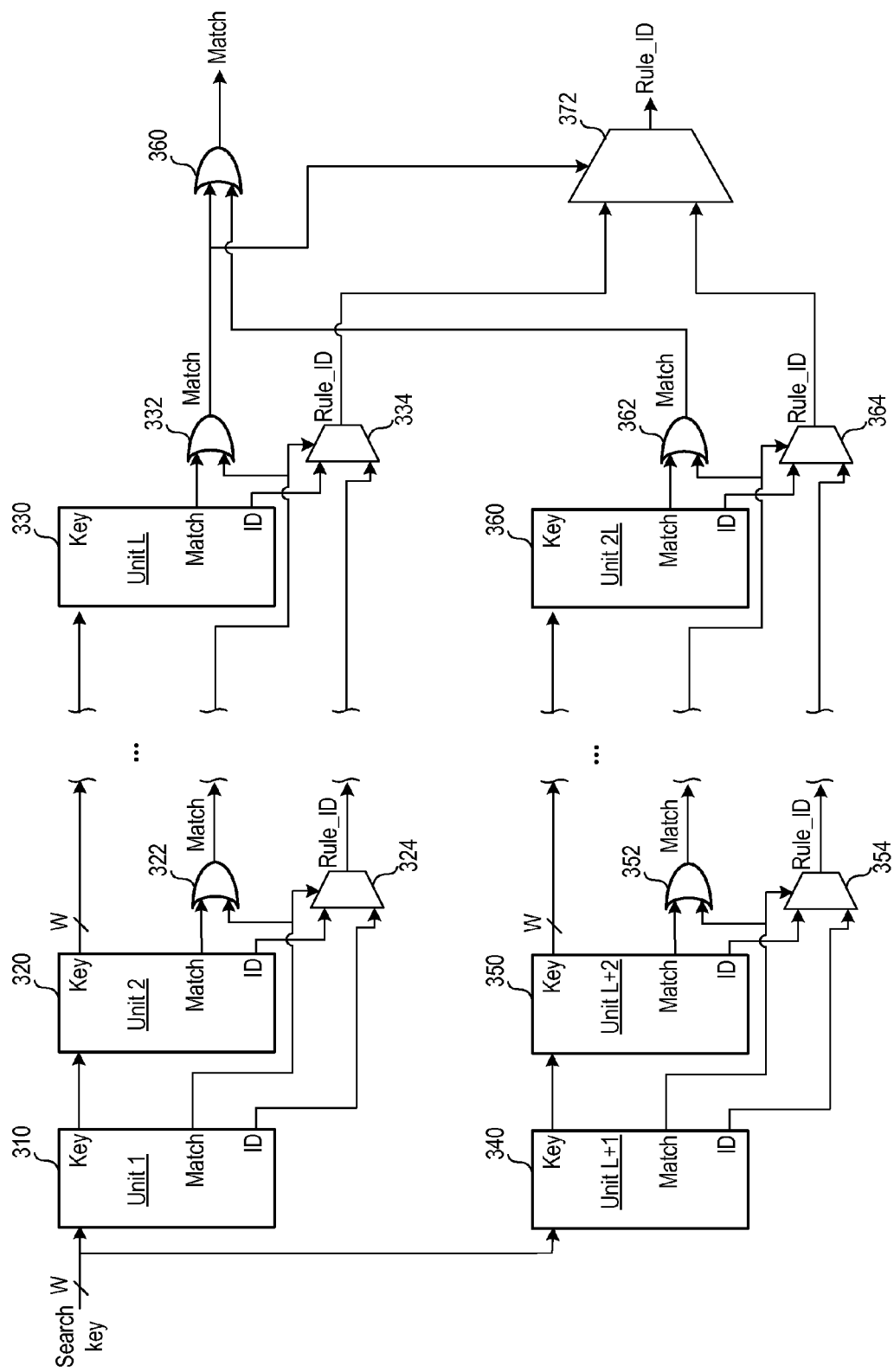
FIG. 3 shows a memory array having a plurality of TCAM memory units.

FIG. 3 shows multiple TCAM memory units coupled to form a TCAM memory array. In this example, 2*L memory units are coupled in two rows. The first row is formed by memory units 1 through L (310, 320, and 330), and the second row is formed by memory units L+1 through 2*L (340, 350, and 360). In each row, each memory unit of a row is coupled to receive an input search key and provide the input search key to the next memory unit in the row. As described with reference to the memory unit 102 shown in FIG. 1, each memory unit is configured to output a match signal indicating whether or not the input search key matches any of the rules stored in the memory unit. Each memory unit is also configured to output a Rule ID of one of the rules that matches the search key and has the highest priority.

The array includes output circuitry configured to combine the match signals and output the rule ID having the highest priority. In this example, the output circuitry includes a respective OR gate following each memory unit in a row, other than the first memory units 310 and 340. In this example, OR gates 322 and 332 follow respective stages 320 and 330 in row 1 and OR gates 352 and 362 follow respective stages 350 and 360 in row 2. Each of the OR gates generates a match signal indicating if a match has been found in any of the preceding memory units in the row. An additional OR gate 360 is coupled to receive the match signal provided by the last OR gate in each row (e.g., 332 and 362) and output a match signal indicating if a match has been found in any of the memory units in the array.

The output circuitry also includes a number of multiplexors 324, 354, 334, 364 configured to determine a rule ID of a matching rule having the highest priority. In this example, rules with higher priority are stored in the memory units with lower index. In each row, rules stored in rightmost units have highest priority. For instance, in the first row including memory units 310, 320, and 330, rules stored in memory unit 310 have the highest priority and rules stored in memory unit 330 have the lowest priority. Also, rules stored in the first row have higher priority than rules stored in the second row. For instance, the lowest priority rules of the first row, stored in memory unit 330, have a higher priority than the rules stored in memory units 340, 350, and 360 of the second row.

For each memory unit in a row, other than the first memory units 310 and 340, the output circuitry includes a respective multiplexor following the memory unit. In this example, multiplexors 324 and 334 follow respective stages 320 and 330 in row 1 and multiplexors 354 and 364 follow respective stages 350 and 360 in row 2. The multiplexors are configured to provide the rule ID output from the leftmost memory unit in the row in which a match has been found. For instance, the first row includes a first multiplexor 324 having a first input coupled to receive the rule ID output from the first memory unit 310 in the row and a second input coupled to receive the rule ID output from the second memory unit 320 in the row. If the match signal of the first memory unit 310 indicates a match has been found, the multiplexor 324 outputs the rule ID from the first memory unit. Otherwise, the multiplexor 324 outputs the rule ID from the second memory unit 320. The last multiplexor in the row 334 provides the rule ID of the leftmost memory unit in which a match has been found. Similarly, the output circuitry also includes a multiplexor 372 configured to select and output the rule ID provided by the topmost row in which a match has been found.

The lookup latency of the TCAM memory array shown in FIG. 3 is (L*H)+2 cycles, where L is the number of units per row and H is the number of stages per unit. The two additional cycles in the latency calculation includes 1 cycle for final priority encoding and status checking performed by circuits 360 and 372, and 1 cycle for final registered outputting.

To add/remove/modify a rule in the RAM-based TCAM memory unit, a respective data word is retrieved from each memory address in a RAM of the TCAM memory unit. In each of the retrieved data words, a bit is modified at a bit position corresponding to the rule to be updated. More specifically, the bit is modified to have a value indicating if the corresponding memory address matches a portion of the rule stored in the RAM. The modified data word is then written back to the same memory address of the RAM.

Figure 4:
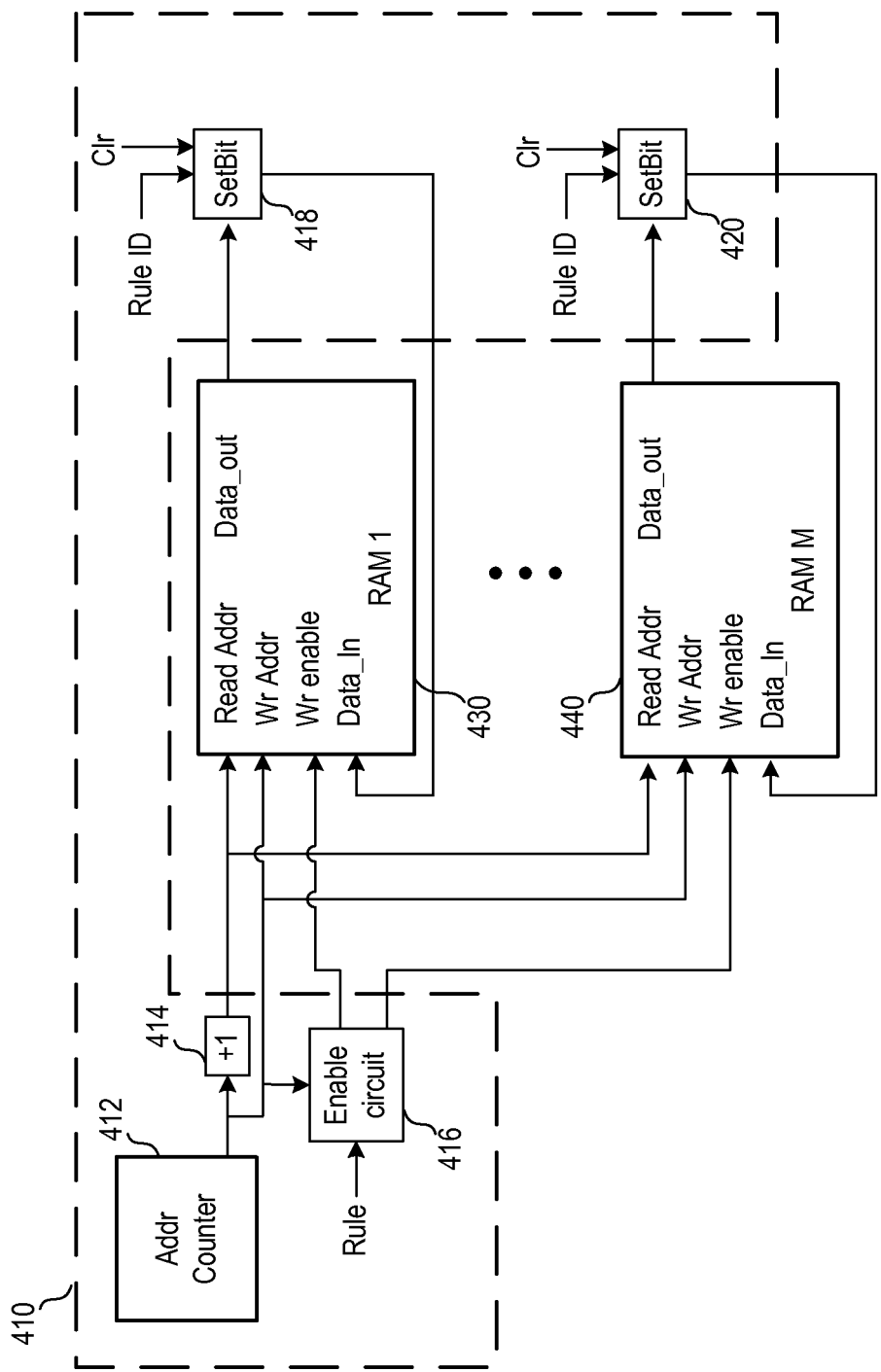
FIG. 4 shows an update circuit that may be used to update ternary values stored in RAM of a TCAM memory unit.

FIG. 4 shows a block diagram of an update circuit that may be used to add/remove rules in a RAM based TCAM. In this example, update circuit 410 is configured to add/remove rules to/from a plurality of RAM units 430 and 440 of a stage, as that shown in FIG. 2. The update circuit 410 includes an address selection circuit implemented by address counter 412 and increment block 414. The address selection circuit is configured to sequentially select each memory address of the RAM units 430 and 440. In each iteration, a data word is retrieved from address X and is modified/updated. In the next iteration, a data word is retrieved from address X+1 and the previously modified/updated data word is written back to address X. This allows one memory address to be updated in each clock cycle.

The latency of a rule update depends on the largest RAM unit used. If the depth of the largest RAM has $2^P$ memory addresses, then it takes $2^P+1$ clock cycles to complete a rule update. The extra one clock cycle is needed to read the old content on the address 0 before writing. This implementation requires that each RAM unit include at least two access ports to facilitate simultaneous read and write of the data words. In some alternate implementations, the update circuit may be configured to update rules in a RAM having a single access port by alternating between read and write operations every other clock cycle.

The update circuit 410 includes respective SetBit circuits 418 and 420 for the RAM units 430 and 440. Each SetBit circuit is configured to set/clear a bit of the retrieved word at a bit position indicated by a Rule ID. If a rule indicated by Rule ID is being removed, the bits at the bit position are set to logic 0 by the SetBit circuits 418 and 420. If a rule is being added, each of the bits at the bit position is set to logic 1 by the SetBit circuits (418 and 420).

The update circuit includes an enable circuit 416 configured to determine if the bit for a rule should be logic 1 or 0 for each address. For instance, if the portion of the rule stored by a ram unit matches the current write address, the enable circuit 416 enables the RAM unit to write the modified word back into memory—thus setting the bit to 1. Otherwise, the enable circuit 416 disables writing to the RAM unit—thus keeping the bit at 0. This implementation requires that each bit be previously set to logic 0 before writing a word. Also, this implementation only allows one rule to be updated in a RAM unit at a time. In some other implementations, an update circuit may be configured to set update a rule by modifying bits without previously setting the bits to logic zero and/or to update multiple rules at a time.

Figure 5:
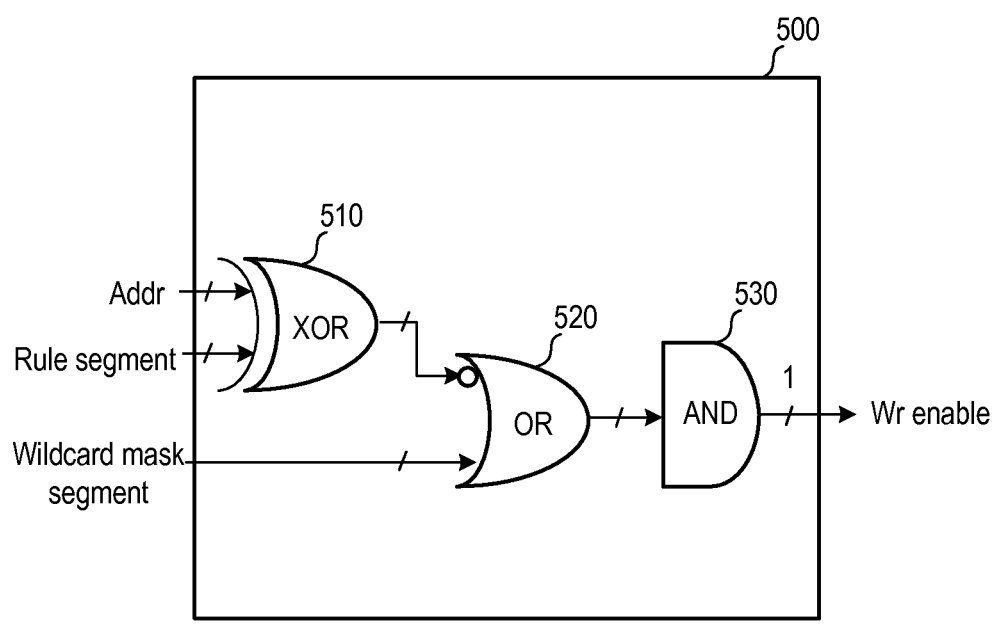
FIG. 5 shows a circuit for enabling write access to a memory block for memory addresses that satisfy a rule to be stored.

FIG. 5 shows a circuit for enabling writes to a RAM block when an input memory address satisfies an input rule to be stored. The circuit 500 may be used, for example, to update one of the RAM blocks shown in FIG. 4. The circuit 500 includes a bitwise XOR circuit 510 configured to output a value indicating if an input memory address, such as that selected by address counter 412 in FIG. 4, matches binary data values of the portion of a rule to be stored in the RAM. The value output by the XOR circuit 510 has bits equal to logic 0 if the bits match. This value is inverted so the bits equal logic 1 if the corresponding bits of the address and rule match. An OR gate 520 is coupled to receive the inverted output of the circuit 510 and a mask value. The mask value has a logic 1 for each wildcard * bit of the rule. If each bit output by the OR gate 520 is logic 1, then each bit of the relevant portion of the rule either matches the address or is a wildcard bit. The circuit 500 includes an AND gate 530 having inputs coupled to receive respective bits of the value output by OR gate 520. The AND gate 530 outputs a signal set to logic 1 if each bit of the relevant portion of the rule either matches the address or is a wildcard bit. Otherwise, the signal is set to logic 0. This signal may be used as an enable signal to determine if a bit of a rule should be set to logic 1 or logic 0 at each memory address.

As discussed with reference to FIG. 3, multiple TCAM memory units may be coupled in an array of columns and rows with each TCAM memory unit storing a respective set of rules. In some implementations, each TCAM memory unit of an array may include a respective update circuit. In some other implementations, an update circuit may be used to select and update multiple TCAM memory units in an array. A shared update circuit may be used to update rules of one memory unit at a time. In some implementations, a shared update circuit may include a scheduling circuit to schedule multiple consecutive updates of the rules in different TCAM memory units.

Figure 6:
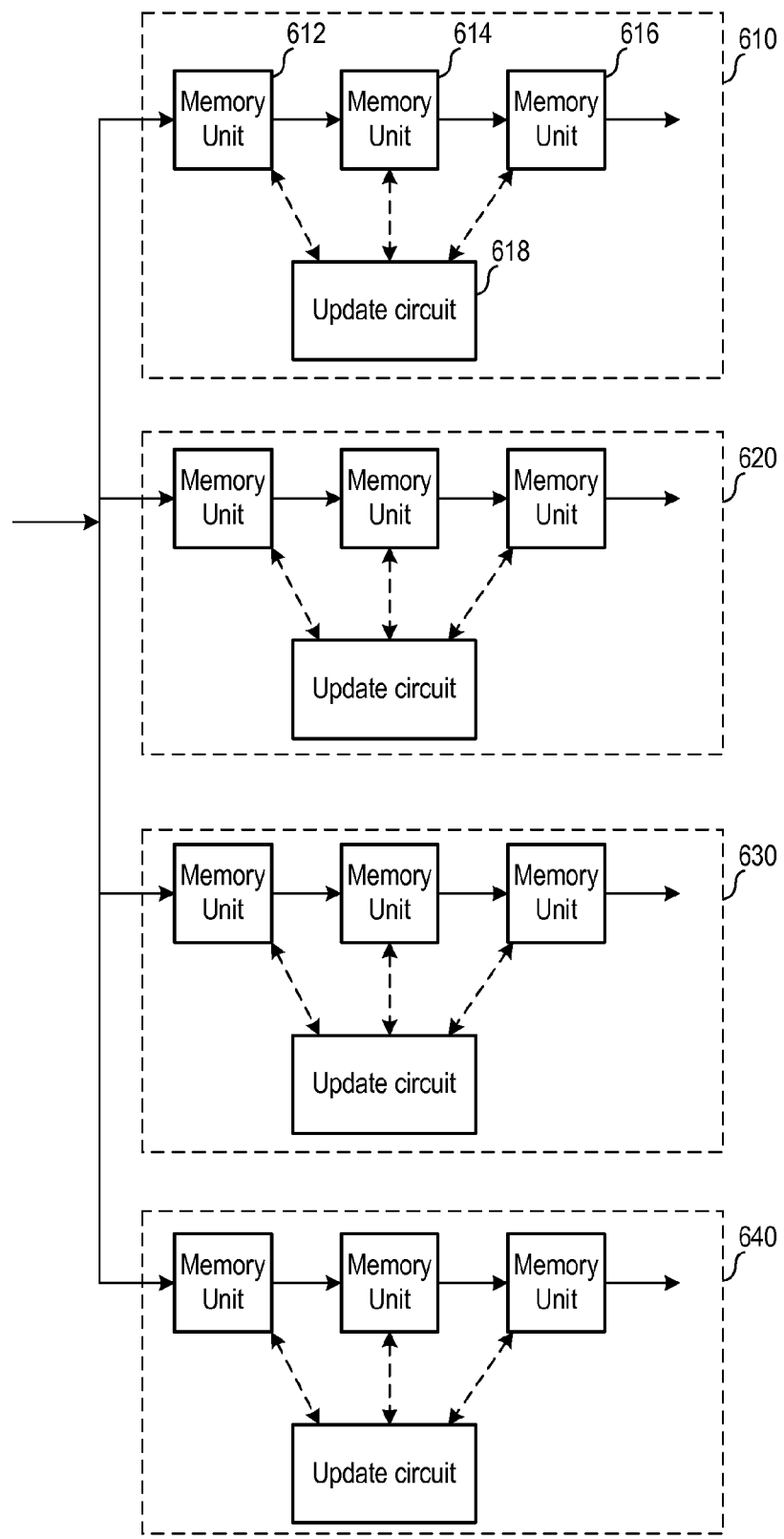
FIG. 6 shows an array of TCAM memory units having update circuits coupled to the memory units in a first arrangement.
Figure 7:
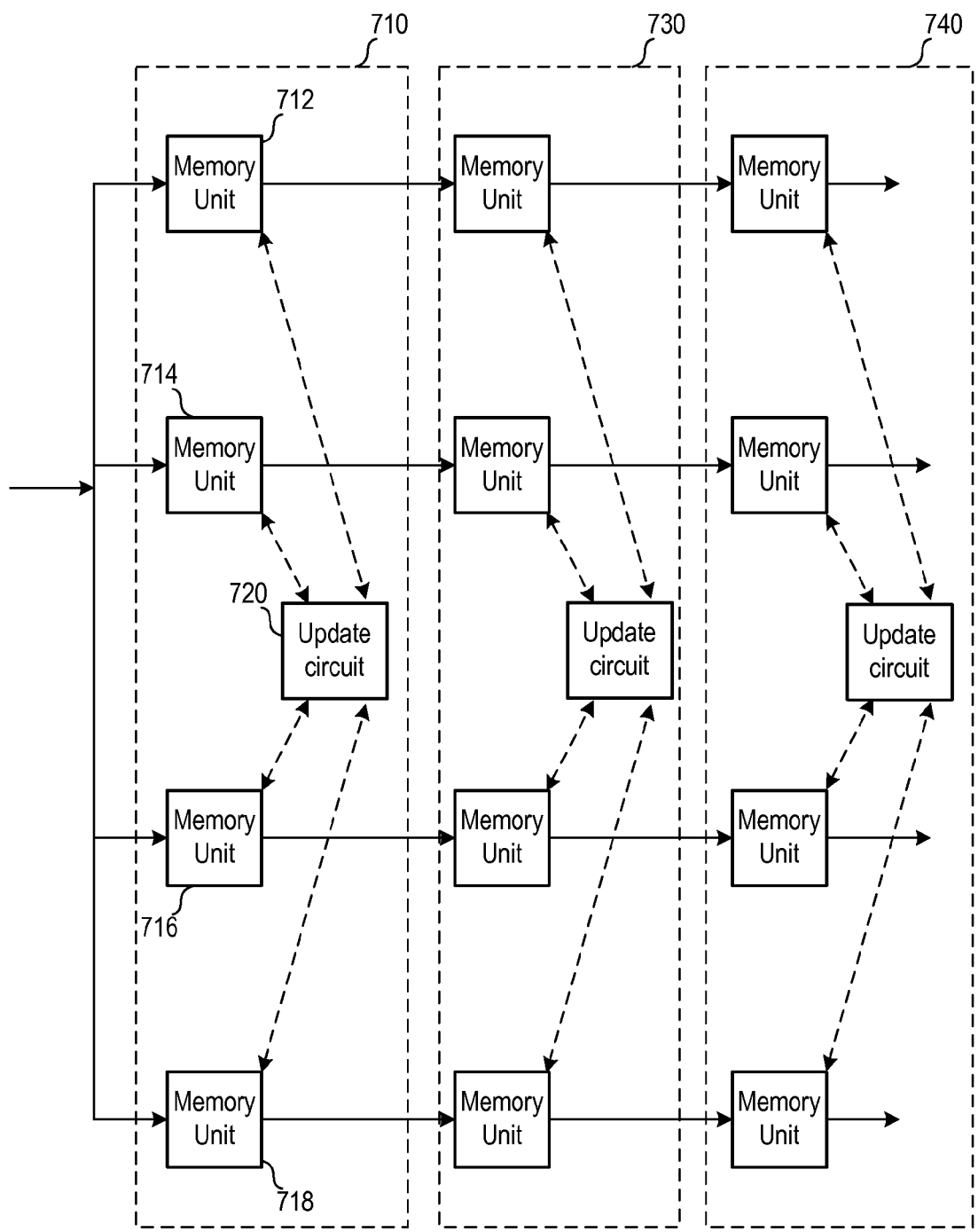
FIG. 7 shows an array of TCAM memory units having update circuits coupled to the memory units in a second arrangement.
Figure 8:
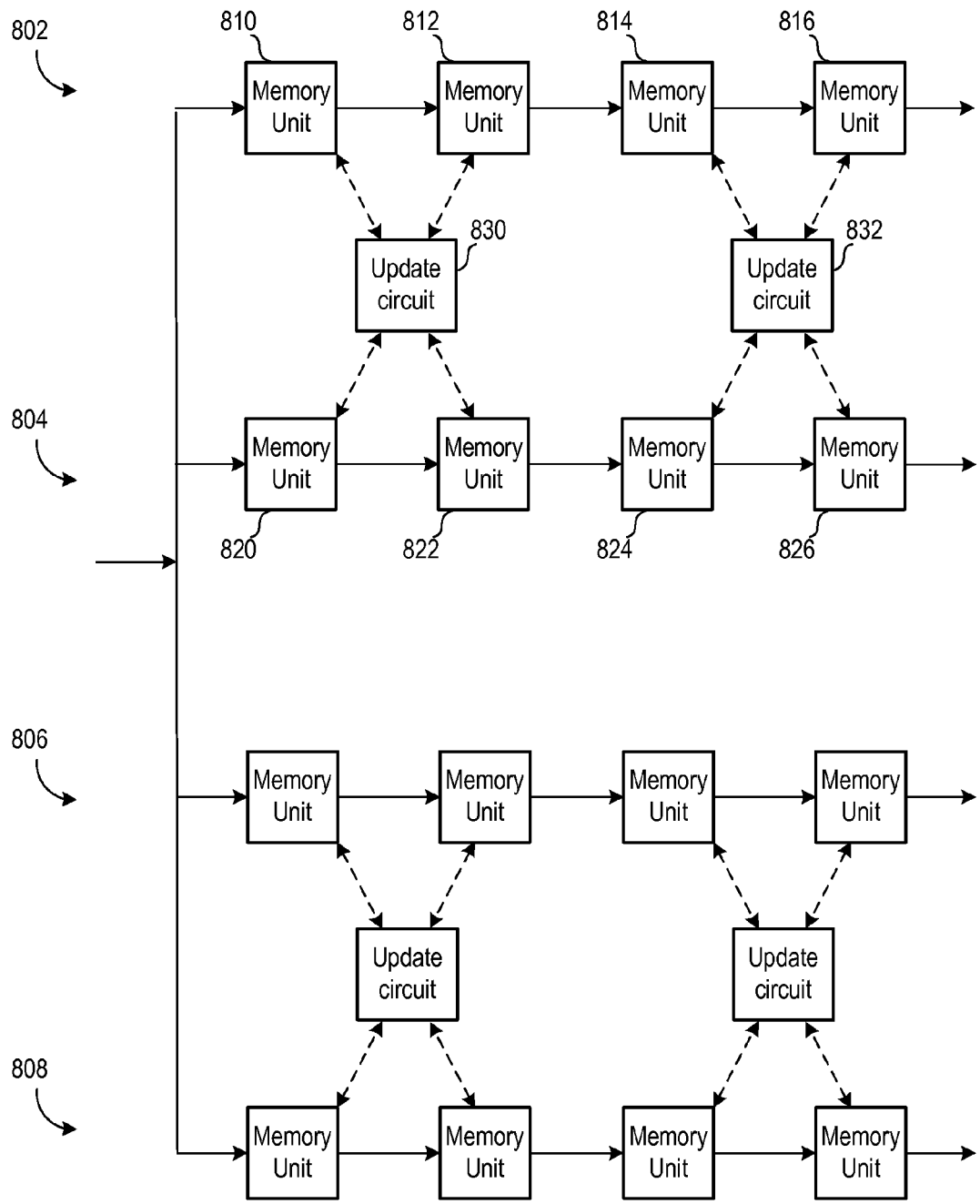
FIG. 8 shows an array of TCAM memory units having update circuits coupled to the memory units in a third arrangement.

TCAM memory units and update circuits may be coupled in various arrangements as required for different applications. For instance FIGS. 6, 7, and 8 show three respective configurations of a TCAM array having shared update circuits. FIG. 6 shows an array of TCAM memory units having update circuits coupled to the memory units in a first arrangement. In this example, TCAM memory units are coupled in four rows (610, 620, 630, and 640). As shown in the first row 610, each row includes three respective TCAM memory units (612, 614, and 616) and one shared update circuit 618. However, the arrangement may be adapted to include more or less TCAM memory units in each row or include more or less rows. In this arrangement, the size of the TCAM can be increased without significant modification to the update logic by adding additional rows of TCAM units with respective update circuits, as shown in the first row 610.

FIG. 7 shows an array of TCAM memory units having update circuits coupled to the memory units in a second arrangement. In this example, TCAM memory units are coupled in three columns (710, 730, and 740). As shown in the first column 710, each column includes four TCAM memory units (712, 714, 716 and 718), each from a respective row of the array. Each column also includes a shared update circuit 720. However, the arrangement may be adapted to include more or less TCAM memory units in each row or include more or less rows. In this arrangement, the size of the TCAM can be increased without significant modification to the update logic by adding additional columns of TCAM units with respective update circuits, as shown in the first column 710.

FIG. 8 shows an array of TCAM memory units having update circuits coupled to the memory units in a third arrangement. In this example, TCAM memory units are coupled in four rows (802, 804, 806, and 808), with four TCAM memory units in each row. For instance, row 802 includes four TCAM memory units 810, 812, 814, and 816 and row 804 includes four TCAM memory units 820, 822, 824, and 826. However, the arrangement may be adapted to include more or less TCAM memory units in each row or include more or less rows.

In this example, the array has multiple shared update circuits, each configured to update two TCAM memory units from a first row and two TCAM memory units from a second row. For instance, update circuit 830 is configured to update TCAM memory units 810 and 812 in row 802 and update TCAM memory units 820 and 822 in row 804. Similarly, update circuit 832 is configured to update TCAM memory units 814 and 816 in row 802 and update TCAM memory units 824 and 826 in row 804. In this arrangement, the size of the TCAM can be increased without significant modification to the update logic by adding two additional columns of TCAM memory units and/or two additional rows of the TCAM memory units. An additional update circuit is needed for every four TCAM memory units added.

The various arrangements shown in FIGS. 6, 7, and 8 are provided for exemplary purposes. It is recognized that TCAM memory units and update circuits may also be coupled in other arrangements in various applications.

The TCAM memory circuits disclosed herein provide a memory efficient approach for storage and retrieval of ternary rules that scales well as the number of bits in the rules increase. As indicated above, some previous TCAM memories may require as much as $O(N^W)$ bits of storage in order to store and search N W-bit rules. In comparison, one example implementation of TCAM memory unit shown in FIG. 1, requires $$2^P * N * \left\lceil \frac{W/H}{P} \right\rceil * H$$

bits of RAM to store and search N W-bit rules, where $2^P$ is the number of memory addresses in each RAM. In this example implementation, the W is evenly divisible by H. As such, each of the stages stores the same number of bits of each rule (W/H). Each RAM size in the stages is: 2P*N and the number of RAMs per stage is $$\frac{W/H}{P}.$$

The total memory requirement (bits) of a unit is:

$$2^P * N * \left\lceil \frac{W/H}{P} \right\rceil * H = \frac{2^P}{P} * N * W$$

bits.

The ratio of a number of required RAM bits to the number of rule bits stored by the TCAM provides a metric for evaluating efficiency of TCAMs. In this example implementation the RAM:TCAM ratio is $2^P/P$. The RAM:TCAM ratio is maintained when multiple TCAM memory units are coupled in rows and columns to form an array, as shown in FIG. 3.

The disclosed TCAM circuits may be adapted to use different types of RAMs in different applications. As indicated by the RAM:TCAM ratio $2^P/P$, use of RAMs with smaller P results in lower ratio and higher memory efficiency. In some implementations, a small RAM:TCAM ratio may be achieved by implementing a TCAM memory unit using programmable look-up tables in a programmable integrated circuit (IC). For instance, the XILINX Virtex-7 programmable IC includes circuits referred to as Distributed RAM circuits, which may be configured as either look-up tables or RAM. As a comparative example, for a TCAM memory unit implemented with 32×6 distributed RAMs, P=5 provides an optimal RAM:TCAM ratio of 6.4. In comparison, for a TCAM memory unit implemented with 512×72 for Block RAM, P=9 yields the optimal RAM/TCAM ratio of 57—indicating worse efficiency in comparison to the Distributed RAM implementation.

Figure 9:
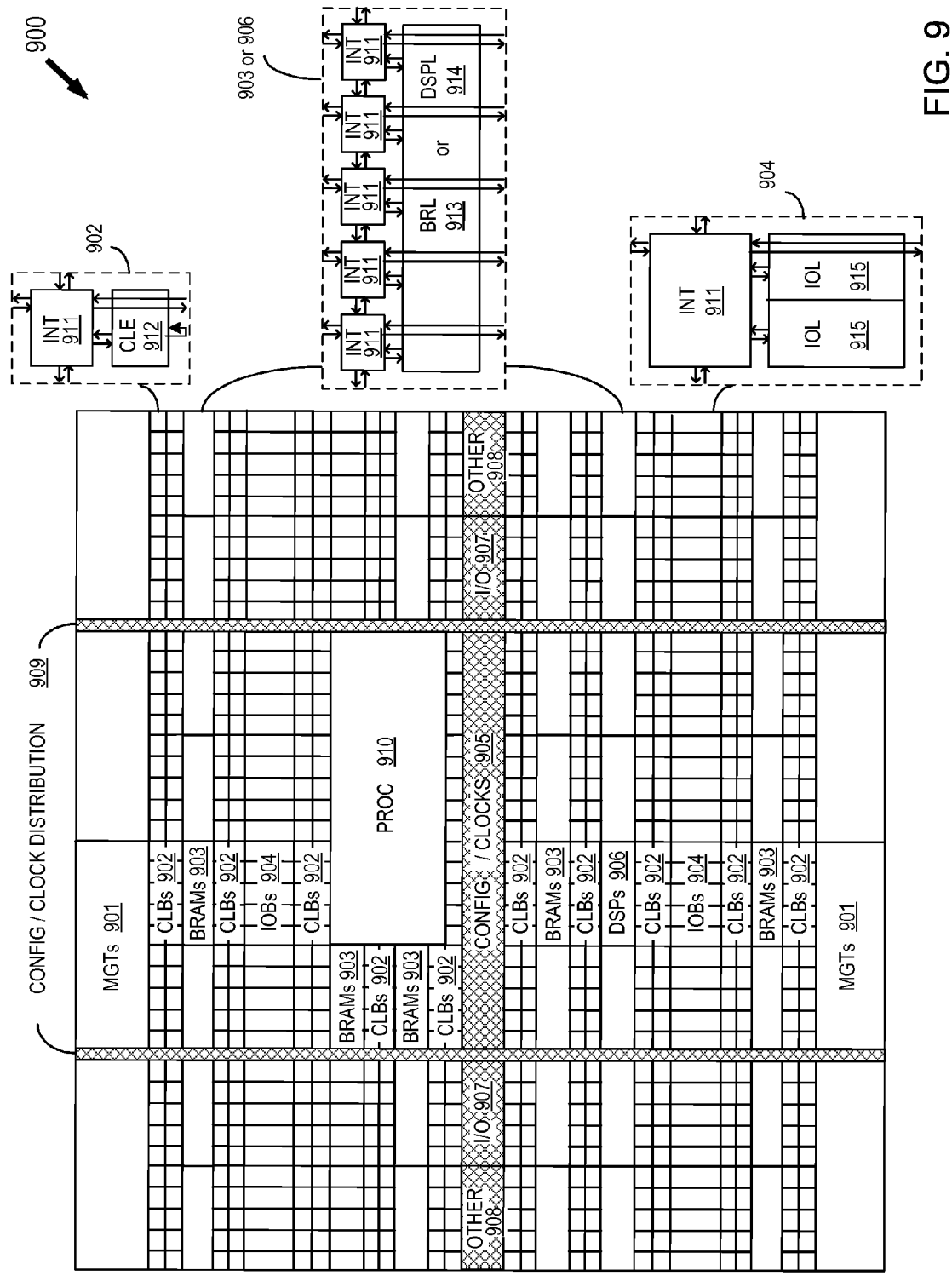
FIG. 9 shows an example programmable integrated circuit (IC) that may be configured to implement a TCAM.

FIG. 9 shows an example programmable IC that may be configured to implement a TCAM, as described above. The block diagram shown in this example depicts one type of programmable IC known as a field programmable gate array (FPGA). FPGAs can include several different types of programmable logic blocks in the array. For example, FIG. 9 illustrates an FPGA architecture (900) that includes a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907), for example, e.g., clock ports, and other programmable logic 908 such as digital clock managers, analog-to-digital converters, system monitoring logic, and so forth. Some FPGAs also include dedicated processor blocks (PROC 910) and internal and external reconfiguration ports (not shown).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic plus a single programmable interconnect element INT 911. A BRAM 903 can include a BRAM logic element (BRL 913) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 906 can include a DSP logic element (DSPL 914) in addition to an appropriate number of programmable interconnect elements. An IOB 904 can include, for example, two instances of an input/output logic element (IOL 915) in addition to one instance of the programmable interconnect element INT 911. As will be clear to those of skill in the art, the actual I/O pads connected, for example, to the I/O logic element 915 are manufactured using metal layered above the various illustrated logic blocks, and typically are not confined to the area of the input/output logic element 915.

In the pictured FPGA, a horizontal area near the center of the die (shown shaded in FIG. 9) is used for configuration, clock, and other control logic. Vertical areas 909 extending from this horizontal area are used to distribute the clocks and configuration signals across the breadth of the FPGA.

Some FPGAs utilizing the architecture illustrated in FIG. 9 include additional logic blocks that disrupt the regular row structure making up a large part of the FPGA. The additional logic blocks can be programmable blocks and/or dedicated logic. For example, the processor block PROC 910 shown in FIG. 9 spans several rows of CLBs and BRAMs.

Note that FIG. 9 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic.

The disclosed TCAM circuits are thought to be applicable to a variety of systems, integrated circuits, and other structures utilizing TCAM memory. Other aspects and features will be apparent to those skilled in the art from consideration of the specification. For example, although aspects and features may in some cases be described in individual figures, it will be appreciated that features from one figure can be combined with features of another figure even though the combination is not explicitly shown or explicitly described as a combination. Various circuits and processes may be implemented using one or more processors configured to execute software, using application specific integrated circuits (ASICs), or using logic on a programmable integrated circuit. It is intended that the specification and drawings be considered as examples only, with a true scope of the invention being indicated by the following claims.

What is claimed is:

1. A memory, comprising:
 a ternary content addressable memory (TCAM) memory unit configured to store a set of rules, the TCAM memory unit including:
  a plurality of stages 1 through H, each stage configured to:
   receive a respective segment of an input search key; and
   provide a result segment at an output of the stage, the result segment including, for each rule of the set of rules, a bit having a state that indicates whether or not the rule matches the respective segment of the input search key;
  a bitwise AND circuit coupled to outputs of stages 1 and 2 of the plurality of stages and configured to perform a bitwise AND of the result segments provided by the stages 1 and 2 and provide a combined result having, for each rule of the set of rules, a respective bit having a state that indicates if the rule matches both of the respective segments received by stages 1 and 2;
  for each stage X, wherein 3≤X≤H, a respective bitwise AND circuit coupled to stage X and configured to produce a combined result equal to a bitwise AND of the result segment provided by stage X and the combined result provided by the bitwise AND circuit coupled to stage X−1, the combined result having, for each rule of the set of rules, a respective bit having a state that indicates if the rule matches all of the respective segments received by stages 1 through X; and
  a status circuit configured to determine if the combined result produced by the bitwise AND circuit coupled to stage H indicates that one or more rules of the set of rules matches the input search key.

2. The memory of claim 1, wherein each stage includes a random access memory (RAM), and the respective result segment received by the stage is stored at an address of the RAM indicated by the respective segment of the input search key.

3. The memory of claim 1, wherein the TCAM memory unit further includes:
 a priority encoder circuit configured to:
  receive the combined result produced by the bitwise AND circuit coupled to stage H; and
  based on the combined result, determine which rule of the set of rules matches all of the respective segments received by stages 1 through H and has a highest priority.

4. The memory of claim 3, wherein the priority encoder circuit is further configured to determine a most significant bit of the combined result having a value indicating that the corresponding rule matches all of the respective segments received by stages 1 through H and has a highest priority.

5. The memory of claim 1, wherein the status circuit is a 1-bit OR circuit having a plurality of inputs, each input coupled to receive a respective bit of the combined result produced by the bitwise AND circuit coupled to stage H.

6. The memory of claim 1, wherein each stage includes:
 a plurality of memory blocks, each memory block configured to:
  receive a respective sub-segment of the respective segment of the input search key received by the stage; and
  output a result sub-segment stored at an address indicated by the respective sub-segment of the input search key, the result sub-segment including, for each rule of the set of rules, a bit having a state that indicates whether or not the rule matches the sub-segment; and
 a bitwise AND circuit coupled to an output of each of the plurality of memory blocks and configured to perform a bitwise AND of the result sub-segment to produce the result segment provided by the stage.

7. The memory of claim 1, wherein each stage includes:
 an update circuit configured to update rules in the TCAM memory unit.

8. The memory of claim 7, wherein the update circuit is configured to update a rule in the TCAM memory unit by:
 at each memory address of a memory circuit, reading a respective word value stored at the address of the memory circuit;
 at a bit position corresponding to the rule in the respective word value, setting the bit to a value indicating if the rule matches the memory address of the memory circuit to produce an updated word value; and
 storing the updated word value at the memory address of the TCAM memory unit.

9. The memory of claim 8, wherein the update circuit is configured to concurrently:
 perform the storing of the updated word value at a memory address X of the TCAM memory unit; and
 perform the reading of a respective word value stored at an address X+1 of the TCAM memory unit.

10. A memory, comprising:
a plurality of ternary content addressable memory (TCAM) memory units each having an input coupled to receive an input search key from an input of the memory, wherein each TCAM memory unit is configured to store a respective set of rules and includes:
   a plurality of stages 1 through H, each stage configured to:
      receive a respective segment of the input search key, the segment including a plurality of bits; and
      provide a result segment including, for each of the respective set of rules, a bit having a state that indicates whether or not the rule matches the segment of the input search key; and
   a first output circuit configured to generate a combined result including, for each rule of the set of rules, a respective bit having a state that indicates if the rule matches all of the respective segments received by each of the plurality of stages;
a second output circuit configured to:
   receive the combined results generated by each of the plurality of TCAM memory units; and
   in response to one or more of the combined results indicating that one or more rules match all of the respective segments, prioritize the one or more rules and output a signal identifying one of the one or more rules having the highest priority; and
one or more update circuits, each configured to update rules in a plurality of TCAM memory units.

11. The memory of claim 10, wherein each update circuit is configured to update a rule in a selected one of the one or more TCAM memory units by:
   at each memory address of a memory circuit included in the TCAM memory unit, reading a respective word value stored at the address of the memory circuit;
   at a bit location corresponding to the rule in the respective word value, setting the bit to a value indicating if the rule matches the memory address of the memory circuit to produce an updated word value; and
   storing the updated word value at the memory address of the TCAM memory unit.

12. The memory of claim 11, wherein each of the update circuits is configured to concurrently:
   perform the storing of the updated word value at a memory address X of the memory circuit; and
   perform the reading of a respective word value stored at an address X+1 of the memory circuit.

13. The memory of claim 10, wherein the first output circuit of each of the plurality of TCAM memory units includes:
   a bitwise AND circuit coupled to outputs of stages 1 and 2 of the plurality of stages and configured to perform a bitwise AND of the result segments provided by the stages 1 and 2 and output a combined result having, for each rule of the set of rules, a respective bit having a state that indicates if the rule matches both of the respective segments received by stages 1 and 2; and
   for each stage X, wherein 3≤X≤H, a respective bitwise AND circuit configured to produce a combined result equal to a bitwise AND of the result segment provided by stage X and the combined result produced by the bitwise AND circuit coupled to stage X−1, the combined result having, for each rule of the set of rules, a respective bit having a state that indicates if the rule matches all of the respective segments received by stages 1 through X.

14. The memory of claim 13, wherein the first output circuit of each of the plurality of TCAM memory units further includes:
   a priority encoder circuit configured to:
      receive the combined result produced by the bitwise AND circuit coupled to stage H; and
      based on the combined result, determine which one of the set of rules matches all of the respective segments received by stages 1 through H and has a highest priority.

15. The memory of claim 14, wherein the priority encoder circuit determines the most significant bit of the combined result that has a value indicating that the corresponding rule matches all of the respective segments received by stages 1 through H and has a highest priority.

16. The memory of claim 13, wherein the first output circuit of each of the plurality of TCAM memory units further includes:
   a status circuit configured to determine if the combined result produced by the bitwise AND circuit coupled to stage H indicates that one or more of the set of rules matches the input search key.

17. The memory of claim 16, wherein the status circuit is a 1-bit OR circuit having a plurality of inputs, each coupled to receive a respective bit of the combined result produced by the bitwise AND circuit coupled to stage H.

18. The memory of claim 10, wherein each stage includes:
   a plurality of memory blocks, each configured to:
      receive a respective sub-segment of the respective segment received by the stage; and
      provide a result sub-segment including, for each rule of the set of rules, a bit having a state that indicates whether or not the rule matches the sub-segment; and
   a bitwise AND circuit coupled to an output of each of the plurality of memory blocks and configured to perform a bitwise AND of the result sub-segments to produce the result segment provided by the stage.

19. The memory of claim 10, wherein in at least one of the plurality of stages:
   a first one of the plurality of stages is configured to receive a first segment of the input search key having a first number of bits; and
   a second one of the plurality stages is configured to receive a second segment of the input search key having a second number of bits different than the first number of bits.

* * * * *